(12) United States Patent
Higuchi

(10) Patent No.: US 8,772,859 B2
(45) Date of Patent: Jul. 8, 2014

(54) SEMICONDUCTOR MEMORY DEVICE

(75) Inventor: Masaaki Higuchi, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 258 days.

(21) Appl. No.: 13/415,057

(22) Filed: Mar. 8, 2012

(65) Prior Publication Data
US 2013/0056814 A1    Mar. 7, 2013

(30) Foreign Application Priority Data

Sep. 2, 2011 (JP) .................... 2011-192011

(51) Int. Cl.
*H01L 29/792* (2006.01)
(52) U.S. Cl.
USPC .............. 257/324; 438/257; 257/E29.309; 257/E21.677
(58) Field of Classification Search
None
See application file for complete search history.

(56) References Cited

U.S. PATENT DOCUMENTS

| 2009/0173981 A1 | 7/2009 | Nitta |
| 2010/0213538 A1 | 8/2010 | Fukuzumi et al. |
| 2010/0244119 A1 | 9/2010 | Fukuzumi et al. |

OTHER PUBLICATIONS

U.S. Appl. No. 13/045,819, filed Mar. 11, 2011, Hiroyasu Tanaka, et al.

*Primary Examiner* — Sonya D McCall Shepard
(74) *Attorney, Agent, or Firm* — Oblon, Spivak, McClelland, Maier & Neustadt, L.L.P.

(57) ABSTRACT

According to one embodiment, a semiconductor memory device includes a substrate, a first stacked body, a second stacked body, a memory film, a gate insulating film, and a channel body. The first stacked body has a plurality of electrode layers and a plurality of first insulating layers. The second stacked body has a selector gate and a second insulating layer. The memory film is provided on a sidewall of a first hole. The gate insulating film is provided on a sidewall of a second hole. The channel body is provided on an inner side of the memory film and on an inner side of the gate insulating film. A step part is provided between a side face of the selector gate and the second insulating layer. A region positioned near a top end of the selector gate of the channel body is silicided.

20 Claims, 10 Drawing Sheets

SEMICONDUCTOR MEMORY DEVICE

CROSS-REFERENCE TO RELATED APPLICATIONS

This application is based upon and claims the benefit of priority from the prior Japanese Patent Application No. 2011-192011, filed on Sep. 2, 2011; the entire contents of which are incorporated herein by reference.

FIELD

Embodiments described herein relate generally to a semiconductor memory device.

BACKGROUND

Three dimensional stacked memory that enables a high degree of integration without being relatively restricted to the limitations in resolution found in lithography technology is receiving focus within the field of semiconductor memory devices. Examples of this type of three dimensional stacked memory include that in which memory strings, arranged in a two dimensional matrix, have a column shaped channel body, a tunnel insulating layer stacked so as to cover the side face of the channel body, a charge accumulation layer, a block insulating layer, and a plurality of sheet shaped electrodes that intersect the channel body and are provided with a prescribed gap in the stacking direction.

This type of three dimensional stacked memory uses Gate Induced Drain Leakage (GIDL) current to erase data. In order to use this type of erasing method, there is a semiconductor memory device that is provided with a diffusion region that contains a high concentration of impurities at the top end portion of the channel body. However, there are concerns of not being able to obtain sufficient erasing speed because increasing impurity concentration in the diffusion region gets more difficult with advancements in miniaturization.

DETAILED DESCRIPTION

Figure 1:
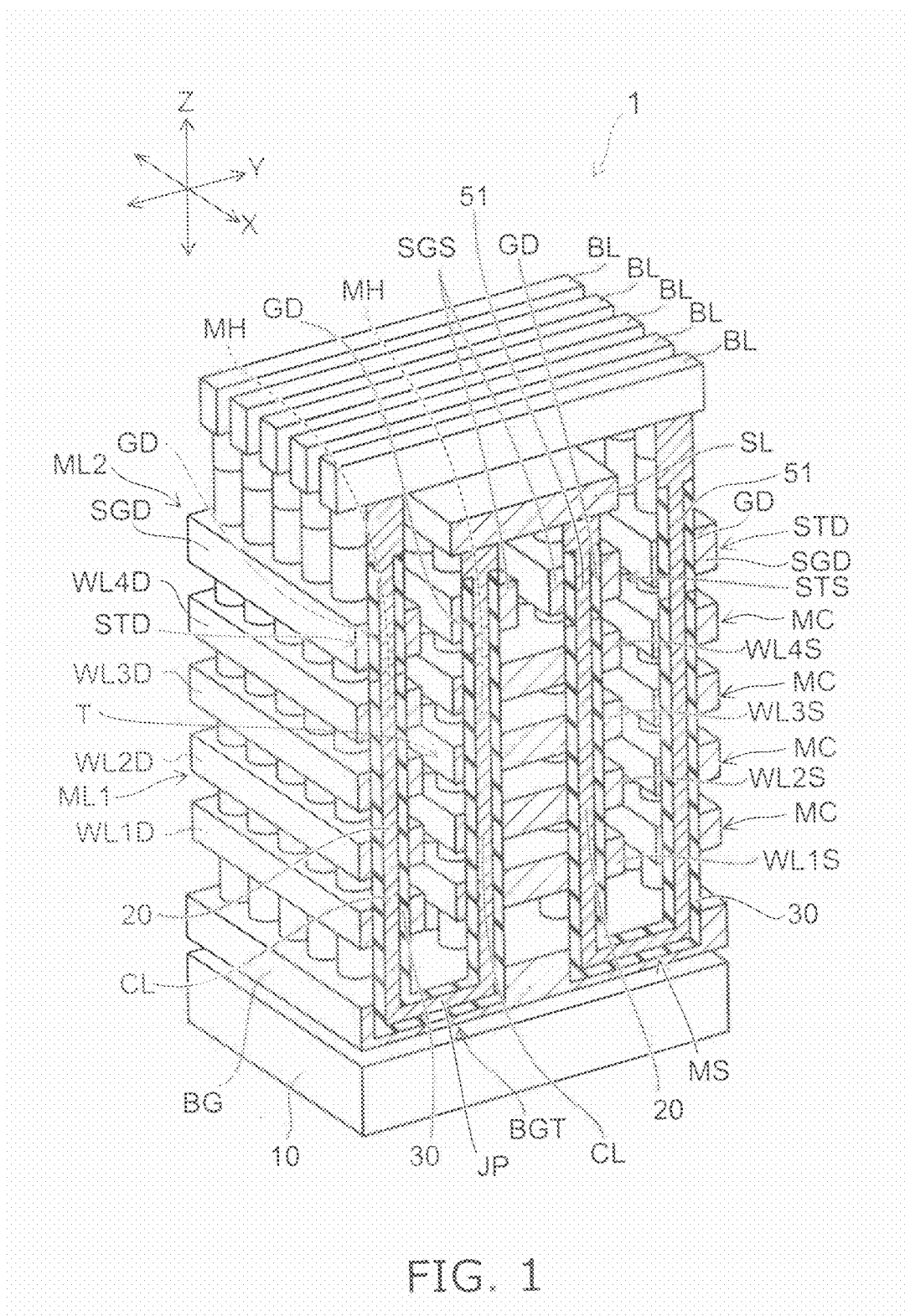
FIG. 1 is a schematic perspective view of a semiconductor memory device according to the first embodiment.

In general, according to one embodiment, a semiconductor memory device includes a substrate, a first stacked body, a second stacked body, a memory film, a gate insulating film, and a channel body. The first stacked body has a plurality of electrode layers and a plurality of first insulating layers stacked on the substrate so as to be respectively alternating. The second stacked body is provided on the first stacked body. The second stacked body has a selector gate and a second insulating layer provided thereon. The memory film is provided on a sidewall of a first hole that penetrates through the first stacked body in the stacking direction. The gate insulating film is provided on a sidewall of a second hole that penetrates through the second stacked body in the stacking direction. The second hole communicates with the first hole. The channel body is provided on an inner side of the memory film and on an inner side of the gate insulating film. A step part is provided between a side face of the selector gate and the second insulating layer. A region positioned near a top end of the selector gate of the channel body is silicided.

Embodiments will now be described with reference to the drawings. Note that the same numerals are applied to similar constituent elements in the drawings and detailed descriptions of such constituent elements are appropriately omitted.

First Embodiment

A semiconductor memory device 1 is provided with a memory region in which memory cells that store data are formed and with a peripheral circuit region where peripheral circuits that drive the memory cells in the memory region are formed. In this case, an example of the peripheral circuit region is omitted as known technology can be applied to the peripheral circuit region. A description of the memory region will be provided herein.

FIG. 1 is a schematic perspective view of a semiconductor memory device according to the first embodiment. Note, in FIG. 1, to avoid complication, illustrations of insulating areas other than an insulating film formed on the inner wall of a memory hole MH is omitted.

Figure 2:
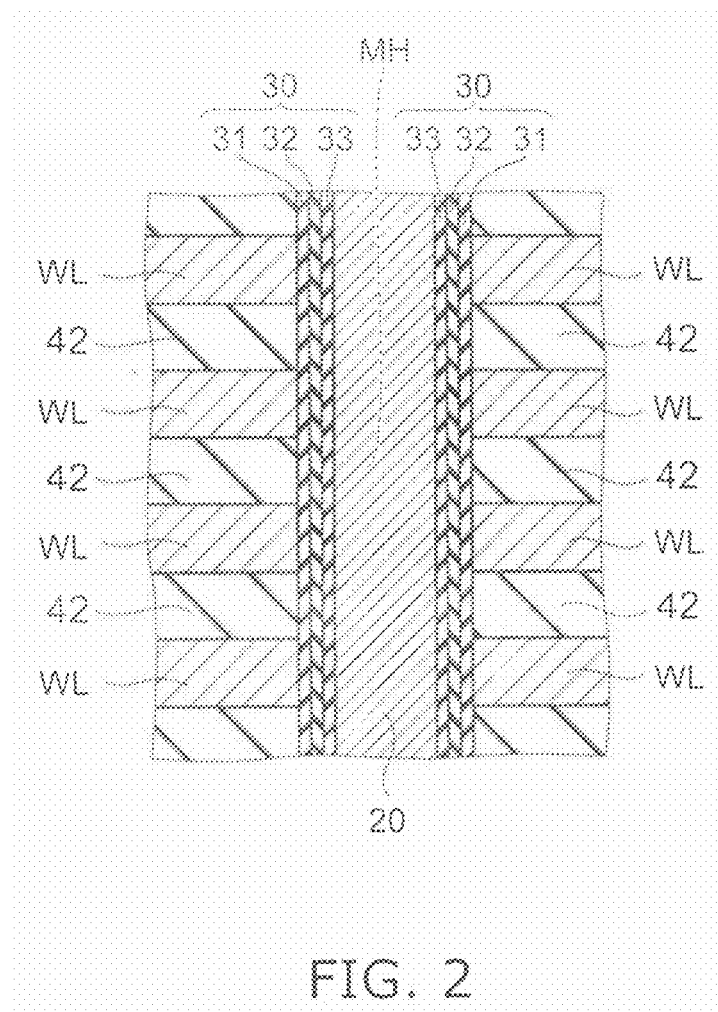
FIG. 2 is a magnified schematic cross-sectional view of a portion where the memory cells in FIG. 1 are provided.

FIG. 2 is a magnified schematic cross-sectional view of a portion where the memory cells in FIG. 1 are provided.

Further, an XYZ orthogonal coordinate system will be introduced in FIG. 1. In this coordinate system, two mutually orthogonal directions parallel to the major surface of a substrate 10 are defined as the X direction and the Y direction, and the direction orthogonal to both the X direction and the Y direction is defined as the Z direction.

In FIG. 1, a back gate BG is provided on the substrate 10 via an insulating layer not illustrated. The back gate BG can be, for example, a conductive silicon layer doped with impurities. On the back gate BG, a plurality of insulating layers 42 (corresponding to one example of a first insulating layer) illustrated in FIG. 2 is respectively stacked alternating with a plurality of electrode layers WL1D, WL2D, WL3D, WL4D, WL1S, WL2S, WL3S, and WL4S. In other words, a first stacked body ML1 is formed having a plurality of electrode layers and a plurality of insulating layers 42 stacked respectively alternating on the substrate 10.

The electrode layer WL1D and the electrode layer WL1S are provided on the same layer and represent the first electrode layer from the bottom. The electrode layer WL2D and the electrode layer WL2S are provided on the same layer and represent the second electrode layer from the bottom. The electrode layer WL3D and the electrode layer WL3S are provided on the same layer and represent the third electrode layer from the bottom. The electrode layer WL4D and the electrode layer WL4S are provided on the same layer and represent the fourth electrode layer from the bottom.

The electrode layer WL1D and the electrode layer WL1S are divided in the Y direction. The electrode layer WL2D and the electrode layer WL2S are divided in the Y direction. The electrode layer WL3D and the electrode layer WL3S are divided in the Y direction. The electrode layer WL4D and the electrode layer WL4S are divided in the Y direction. An isolation trench T with embedded insulating material is formed between the electrode layer WL1D and the electrode layer WL1S, between the electrode layer WL2D and the electrode layer WL2S, between the electrode layer WL3D and the electrode layer WL3S, and between the electrode layer WL4D and the electrode layer WL4S.

The electrode layers WL1D to WL4D are provided between the back gate BG and a drain side selector gate SGD. The electrode layers WL1S to WL4S are provided between the back gate BG and a source side selector gate SGS.

The number of electrode layers is discretionary and is not limited to four layers as illustrated in FIG. 1. Further, in the explanation to be given hereinafter, each of the electrode layers WL1D to WL4D and WL1S to WL4S may be expressed simply as an electrode layer WL.

For example, a conductive silicon layer that has been doped with an impurity may be used as the electrode layer WL. For example, a tetraethoxysilane (TEOS) layer that contains silicon oxide may be used as the insulating layer 42.

The drain side selector gate SGD is provided on the electrode layer WL4D. For example, a conductive silicon layer doped with an impurity may be used as the drain side selector gate SGD.

The source side selector gate SGS is provided on the electrode layer WL4S. For example, a conductive silicon layer doped with an impurity may be used as the source side selector gate SGS.

In other words, a second stacked body ML2, which has selector gates (source side selector gate SGS and drain side selector gate SGD) and an insulating layer 47 (corresponding to one example of a second insulating layer) provided thereon, is provided on the first stacked body ML1. Note, examples of the insulating layer 47 are illustrated in FIG. 3A to FIG. 3F, FIG. 4A to FIG. 4F and the like.

The drain side selector gate SGD and the source side selector gate SGS are divided in the Y direction. Note, in the explanation to be given hereinafter, the drain side selector gate SGD and the source side selector gate SGS may be expressed simply as a selector gate SG without distinction.

A source line SL is provided on the source side selector gate SGS. For example, a metal layer may be used as the source line SL.

A plurality of bit lines BL is provided on the drain side selector gate SGD and the source line SL. Each bit line BL extends in the Y direction.

U shaped memory holes MH are formed in a plurality on the back gate BG and on the stacked body on the back gate BG. Holes that extend in the Z direction are formed by penetrating through the electrode layers WL1D to WL4D and the drain side selector gate SGD. Holes that extend in the Z direction are formed by penetrating through the electrode layers WL1S to WL4S and the source side selector gate SGS. This pair of holes that extend in the Z direction is connected through a recess 81 formed in the back gate BG to form the U shaped memory hole MH.

U shaped channel bodies 20 and 51 are provided in the memory hole MH. For example, a silicon film may be used as the channel bodies 20 and 51. A memory film 30 is provided between the channel body 20 and the inner wall of the memory hole MH.

Gate insulating films GD are provided between the drain side selector gate SGD and the channel body 51 and between the source side selector gate SGS and the channel body 51.

In other words, a memory film 30 is provided on the sidewall of the first hole formed by penetrating through the first stacked body ML1 in the stacking direction (Z direction). Further, the gate insulating film GD is provided on the sidewall of the second hole that communicates with the first hole and that is formed by penetrating through the second stacked body ML2 in the stacking direction. In addition, the channel bodies 20 and 51 are provided on the inner side of the memory film 30 and the inner side of the gate insulating film GD.

In this case, a stacked film that is similarly configured as the memory film 30 may be used as the gate insulating film GD.

Note, this is not limited to the configuration as illustrated in FIG. 1 where the channel body is embedded, in its entirety, in the memory hole MH, but the channel body may be formed so that a cavity remains on the center axis side of the memory hole MH. Alternatively, a configuration may also be adopted in which an insulating material is embedded in a cavity on the inner side of the channel body.

A block film 31, a charge accumulation film 32, and a tunnel film 33 are provided in that order from the electrode layer WL side, as illustrated in FIG. 2, between the channel body 20 and each of the electrode layers WL in a memory cell transistor (hereinafter also referred to simply as a memory cell). The block film 31 contacts the electrode layer WL, and the tunnel film 33 contacts the channel body 20, and the charge accumulation film 32 is provided between the block film 31 and the tunnel film 33.

The channel body 20 functions as a channel in the memory cell transistor, the electrode layer WL functions as a control gate, and the charge accumulation film 32 functions as a data memory layer that accumulates an electric charge infused from the channel body 20. In other words, a memory cell is formed in a configuration in which a control gate encompasses the channel periphery at the location where the channel body 20 and each electrode layer WL intersect.

The semiconductor memory device 1 is a nonvolatile semiconductor memory device that can electrically and freely erase and write data and that can retain memory content even if the power is cut.

The memory cell is, for example, a charge trap type memory cell. The charge accumulation film 32 has a plurality of trap sites that capture a charge and can be, for example, a silicon nitride film. For example, a silicon oxide film can be used as the tunnel film 33 which functions as a potential barrier when a charge is infused from the channel body 20 into the charge accumulation film 32 or when the charge that is accumulated in the charge accumulation film 32 is diffused to the channel body 20.

For example, a silicon oxide film may be used as the block film 31 to prevent the charge that is accumulated in the charge accumulation film 32 from diffusing to the electrode layer WL.

The drain side selector gate SGD, the channel body 51, and the gate insulating film GD therebetween configure the drain side select transistor STD. The channel body 51 in the drain side select transistor STD is connected to the bit line BL.

The source side selector gate SGS, the channel body 51, and the gate insulating film GD therebetween configure the source side select transistor STS. The channel body 51 in the source side select transistor STS is connected to the source line SL.

Note, in the explanation to be given hereinafter, the drain side select transistor STD and the source side select transistor STS may be expressed simply as a select transistor ST without distinction.

The back gate BG, the channel body 20 provided in the back gate BG, and the memory film 30 configure the back gate transistor BGT.

Memory cells MC using each of the electrode layers WL4D to WL1D as a control gate are provided in a plurality between the drain side select transistor STD and the back gate transistor BGT. In a similar manner, memory cells MC using each of the electrode layers WL1S to WL4S as a control gate are also provided in a plurality between the back gate transistor BGT and the source side select transistor STS.

These memory cells MC in a plurality, the drain side select transistor STD, the back gate transistor BGT, and the source side select transistor STS are serially connected through the channel bodies 20 and 51 and configure a single U shaped memory string MS.

One memory string MS includes a pair of column parts CL that extend in the stacking direction of the stacked body that contains the plurality of electrode layers WL, and a junction part JP that is embedded in the back gate BG and is connected to the bottom end of the pair of the column parts CL. Arraying a plurality of these memory strings MS in the X direction and the Y direction enables a plurality of memory cells MC to be provided three dimensionally in the X direction, Y direction, and Z direction.

A plurality of memory strings MS is provided in the memory region on the substrate 10.

In the semiconductor memory device 1, an erasing operation of data is an operation in which electrons are extracted from the charge accumulation film 32 or electron holes are infused into the charge accumulation film 32. The transistor that configures the memory cell MC using the electrode layer WL as a control gate includes a state where the threshold voltage is relatively low (erasing state) and a state where the threshold voltage is relatively high (writing state). In this case, the erasing operation is an operation where the state of the threshold voltage of the memory cell MC is set to be on the low side.

Generally, in memory with a two dimensional structure, electrons written to a floating gate are extracted by raising the substrate potential. However, with this type of the semiconductor memory device 1 with a three dimensional structure of this embodiment, the channel of the memory cell is not directly connected to the substrate. Therefore, a method is used to boost the channel potential of the memory cell by utilizing the gate induced drain leakage (GIDL) current generated by the channel at an end of the selector gate.

For example, a diffusion region doped with a high concentration of impurities is provided at the top end portion of the channel body 51 to generate a high electric field in a depletion layer formed between the selector gate SG and the diffusion region by applying a high voltage to the diffusion region. By doing so, interband tunneling is brought about to raise the channel potential by supplying the generated electron hole to the channel bodies 51 and 20. An erasing operation can be performed by making the potential of the electrode layer WL to be, for example, a ground potential (0V) and extracting electrons from the charge accumulation film 32 by the electric potential difference between the channel body 20 and the electrode layer WL, or by infusing an electron hole into the charge accumulation film 32.

The formation of a diffusion region that contains a high concentration of impurities on the channel body 51 near the top end of the selector gate SG is required in order to increase the speed of this type of erasing operation.

However, with the findings obtained by the inventors of the present invention, it is evident that increasing the impurity concentration in the diffusion region would be difficult in conjunction with miniaturization advancements in the semiconductor memory device 1. Therefore, there are concerns of not being able to obtain sufficient erasing speed in conjunction with the miniaturization advancements in semiconductor memory devices.

Therefore, the semiconductor memory device 1 is such that sufficient erasing speed can be obtained even with advancements in miniaturization in semiconductor memory devices by siliciding the region positioned near the top end of the selector gate SG of the channel body 51.

FIG. 3A to FIG. 3F are magnified schematic cross-sectional views near the top end of the selector gate.

Figure 3A:
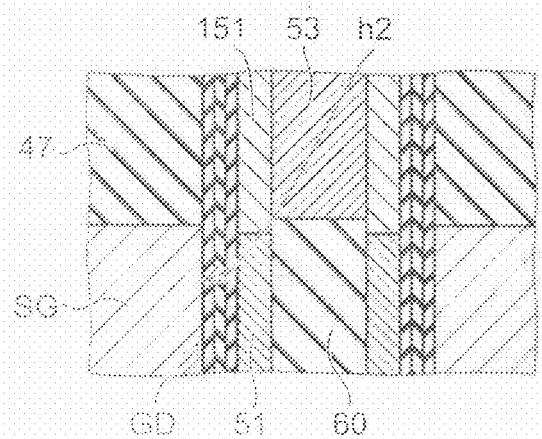
FIG. 3A to FIG. 3F are magnified schematic cross-sectional views near the top end of the selector gate.

FIG. 3A illustrates the insulating layer 47 formed on the selector gate SG. Further, the hollow channel body 51 is formed in a hole h2 (corresponding to one example of a second hole) that penetrates through the selector gate SG. The gate insulating film GD is formed between the channel body 51 and the inner wall of the hole h2. An insulating part 60 is formed in the hollow channel body 51. The top end of the insulating part 60 is provided near the top end of the selector gate SG. The insulating part 60 may be that formed using, for example, silicon oxide, silicon nitride or the like. A wiring electrode part 53 is formed on the inner side of the hollow channel body 51 and upward of the selector gate SG. The wiring electrode part 53 may be that formed using, for example, a semiconductor doped with impurities or a metal or the like such as tungsten.

A region 151 positioned near the top end of the selector gate SG of the channel body 51 is silicided.

In this case, the bottom end of the silicided region 151 is provided lower than the top end of the selector gate SG. In other words, the bottom end of the silicided region 151 is in the same position as the top end of the selector gate SG, or the bottom end of the silicided region 151 is in a lower position beyond the top end of the selector gate SG.

The silicided region 151 may be that in which the main components are, for example, silicon and metal. Further, that in which the main components are metal and a semiconductor that contains a heterogenous element such as germanium may also be used. In this case, the metal may be, for example, tungsten, nickel, cobalt, platinum, zirconium, hafnium, holmium, yttrium, or the like. The dimension in the Z direction (thickness dimension) of the silicided region 151 is approximately between 1 nm and 20 nm.

According to this embodiment, because the silicided region 151 is formed near the top end of the selector gate SG, the carrier concentration in this area can be increased. Therefore, the p-n junction where a reverse bias is applied at the time of applying pass voltage when erasing becomes a high electric field. The result thereof is that because a band-to-band tunnel current (BTBT current) can be generated at a low voltage, erasing speed can be accelerated thereby enabling a sufficient erasing speed to be obtained.

Further, the contact resistance can be reduced by forming the silicided region 151 near the top end of the selector gate SG. Therefore, because the read voltage, write voltage, and erase voltage can be reduced, the read time can also be shortened.

Figure 3B:
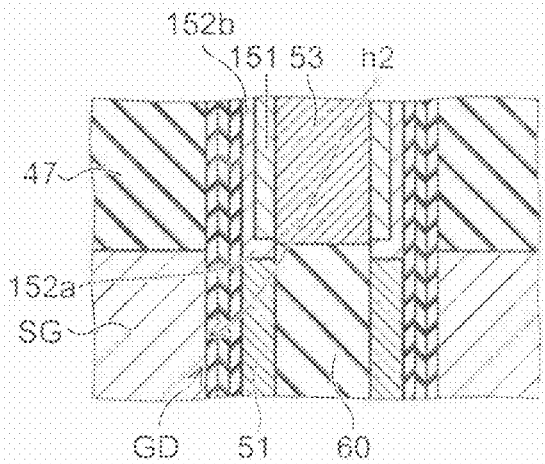

FIG. 3B is a magnified schematic cross-sectional view of the top end of the selector gate according to another embodiment.

FIG. 3B illustrates an example of when a segregating part is further formed in addition to the configuration illustrated in FIG. 3A.

As illustrated in FIG. 3B, a segregating part 152a where impurities are segregated (corresponding to one example of a first segregating part) is formed near the boundary between the silicided region 151 and the non-silicided region of the channel body 51. Further, a segregating part 152b where impurities are segregated (corresponding to one example of a second segregating part) is formed near the boundary between the silicided region 151 and the gate insulating film GD. Note, a configuration is also possible in which at least only the segregating part 152a is formed.

Further, the bottom end of the segregating part 152a is provided lower than the top end of the selector gate SG. In other words, the bottom end of the segregating part 152a is in the same position as the top end of the selector gate SG, or the bottom end of the segregating part 152a is in a lower position beyond the top end of the selector gate SG. In this case, the bottom end of the silicided region 151 may also be above the bottom end of the segregating part 152a.

The segregating parts 152a and 152b can also be formed by segregating an impurity such as arsenic or the like.

According to this embodiment, by forming the segregating part 152a in which impurities such as arsenic or the like are segregated, a highly concentrated n+ layer can be formed near the boundary between the region 151 and the channel body 51. Therefore, a steep step p-n junction can be formed and the p-n junction where a reverse bias is applied at the time of applying pass voltage when erasing becomes a further high electric field. The result thereof is that because a band-to-band tunnel current (BTBT current) can be generated at a lower voltage, erasing speed can be accelerated thereby enabling a more sufficient erasing speed to be obtained.

Further, by forming the segregating part 152b in which impurities such as arsenic or the like are segregated, effects on the electric field due to a fixed charge of the gate insulating film GD can be suppressed. Further, because depletion can be suppressed and On resistance, read voltage, right voltage, erase voltage, and the like can be reduced, the read time can be further shortened.

Note, the effect of forming the silicided region 151 near the top end of the selector gate SG is similar to that illustrated in FIG. 3A.

Figure 3C:
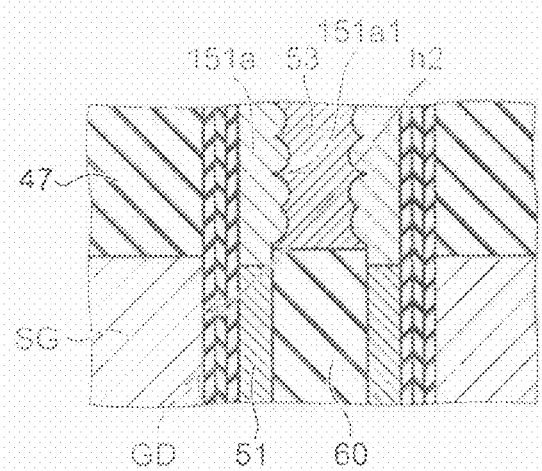

FIG. 3C is also a magnified schematic cross-sectional view near the top end of the selector gate according to another embodiment.

FIG. 3C illustrates an example of when concave and convex portions 151a1 are formed on the surface of the wiring electrode part 53 side of the silicided region 151a in addition to the configuration illustrated in FIG. 3A.

Other than the concave and convex portions 151a1 being formed on the silicided region 151a, it may be the same as the silicided region 151 described above. For example, the main components of the silicided region 151a and the positional relationship and the like of the bottom end of the silicided region 151a with the top end of the selector gate SG may be the same as the silicided region 151 described above.

According to this embodiment, because the concave and convex portions 151a1 are formed on the surface of the wiring electrode part 53 side of the silicided region 151a, the contact surface area with the wiring electrode part 53 can be larger. Therefore, because the contact resistance can be reduced, the read voltage, write voltage, and erase voltage can be reduced and the read time can be shortened.

Note, the effect of forming the silicided region 151a near the top end of the selector gate SG is similar to that illustrated in FIG. 3A.

Figure 3D:
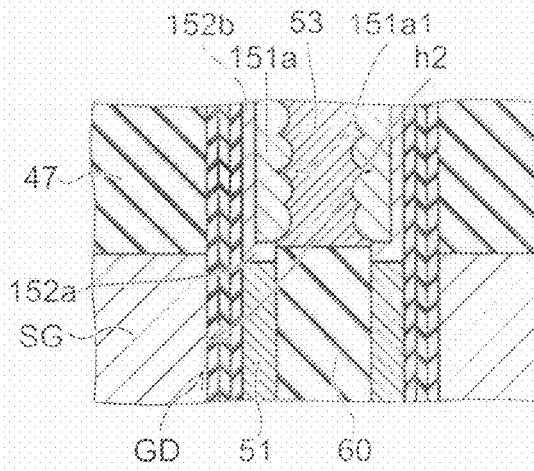

FIG. 3D is also a magnified schematic cross-sectional view near the top end of the selector gate according to another embodiment.

FIG. 3D illustrates an example of when a segregating part is further formed in addition to the configuration illustrated in FIG. 3C.

In other words, the segregating part 152a where impurities are segregated is formed near the boundary between the silicided region 151a and the non-silicided region of the channel body 51. Further, the segregating part 152b where impurities are segregated is formed near the boundary between the silicided region 151a and the gate insulating film GD. Note, a configuration is also possible in which at least only the segregating part 152a is formed.

In this case, the main components and positional relationships and the like of the segregating parts 152a and 152b may be similar to that illustrated in FIG. 3B.

According to this embodiment, the effect of forming the concave and convex portions 151a1 as illustrated in FIG. 3C, the effect of forming the segregating parts 152a and 152b as illustrated in FIG. 3B, and the effect of forming a silicided region as illustrated in FIG. 3A, can be taken advantage of in combination.

Figure 3E:
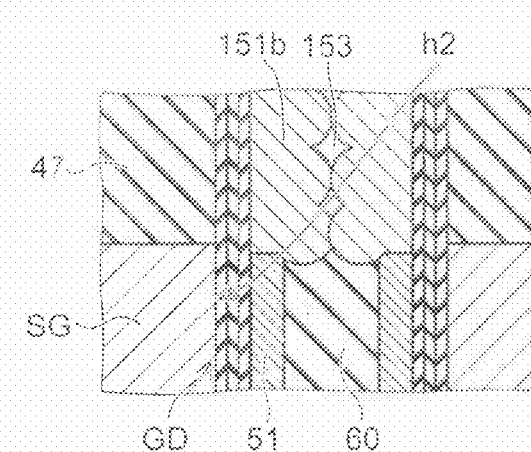

FIG. 3E is also a magnified schematic cross-sectional view near the top end of the selector gate according to another embodiment.

FIG. 3E illustrates an example of when the silicided region 151b is expanded and the region 151b and the wiring electrode part are integrated in the configuration illustrated in FIG. 3C. In other words, in this embodiment, the silicided region 151b also having the function of the wiring electrode part is formed near the top end of the selector gate SG and on the inner side of the gate insulating film GD. Further, a space 153 (corresponding to one example of a first space) is formed in the silicided region 151b. Note, the main components of the silicided region 151b and the positional relationship and the like of the bottom end of the silicided region 151b with the top end of the selector gate SG may be the same as the silicided region 151 described above.

Note, the effect of forming the silicided region 151b near the top end of the selector gate SG is similar to that illustrated in FIG. 3A.

Figure 3F:
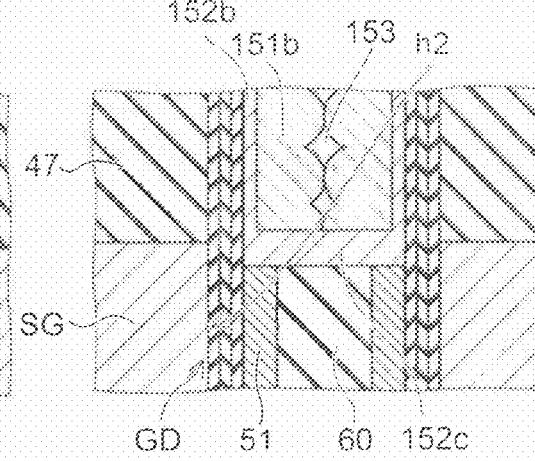

FIG. 3F is also a magnified schematic cross-sectional view near the top end of the selector gate according to another embodiment.

FIG. 3F illustrates an example of when a segregating part is further formed in addition to the configuration illustrated in FIG. 3E.

In other words, a segregating part 152c where impurities are segregated is formed on the boundary side between the silicided region 151b and the non-silicided region of the channel body 51. Further, the segregating part 152b where impurities are segregated is formed near the boundary between the silicided region 151b and the gate insulating film GD. Note, a configuration is also possible in which at least only the segregating part 152c is formed.

In this case, the main components and positional relationships and the like of the segregating parts 152c and 152b may be similar to that illustrated in FIG. 3B.

According to this embodiment, the effect of expanding the silicided region 151b and forming the space 153 as illustrated in FIG. 3E, the effect of forming the segregating parts 152a and 152b as illustrated in FIG. 3B, and the effect of forming the silicided region as illustrated in FIG. 3A, can be taken advantage of in combination.

FIGS. 4A to 4F are also magnified schematic cross-sectional views near the top end of the selector gate according to another embodiment.

In FIG. 3A to FIG. 3F, a memory hole formed without a level difference is illustrated, and FIG. 4A to FIG. 4F illustrate a step part 50, which is formed between the side face of the selector gate SG and the insulating layer 47.

Figure 4A:
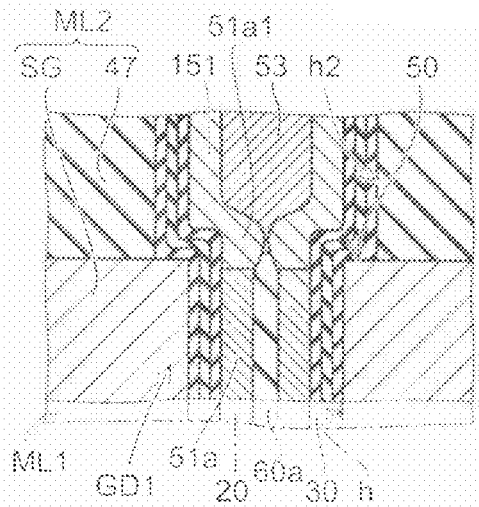
FIG. 4A to FIG. 4F are also magnified schematic cross-sectional views near the top end of the selector gate according to another embodiment.
Figure 4B:
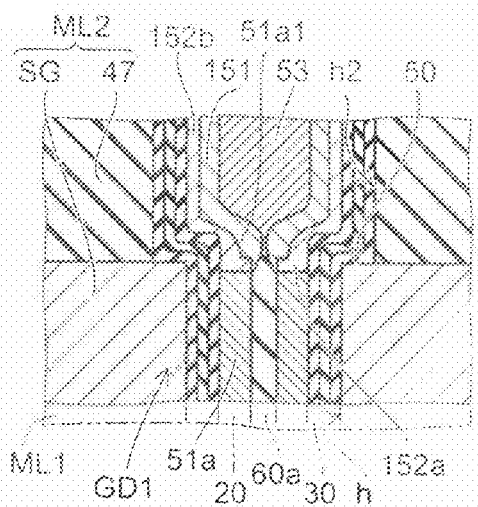
Figure 4C:
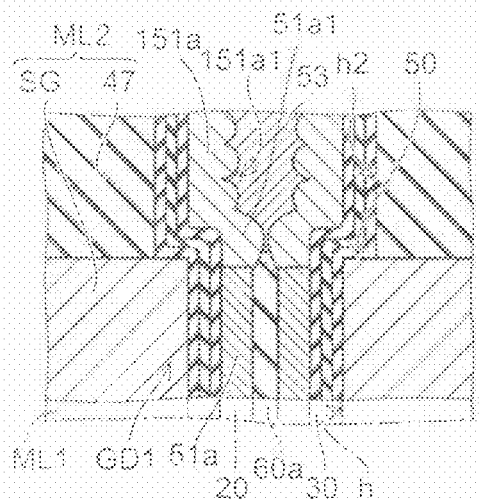
Figure 4D:
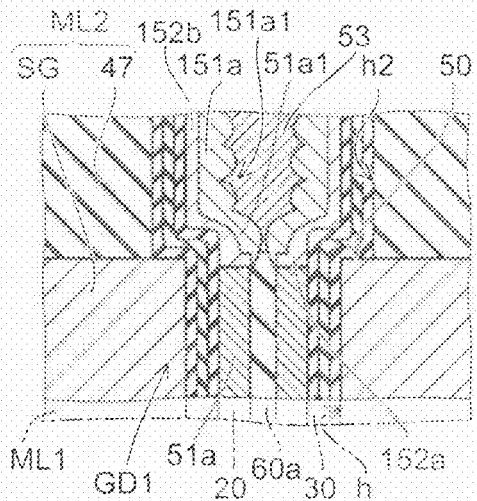
Figure 4E:
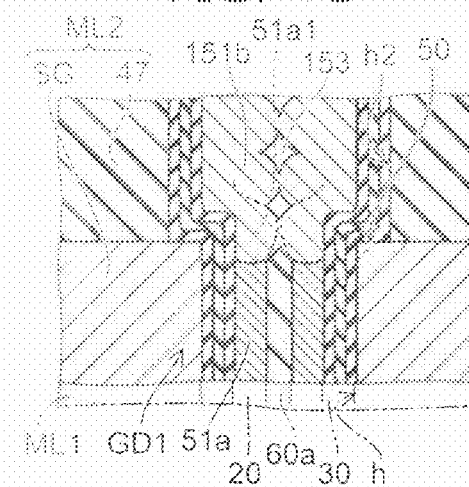
Figure 4F:
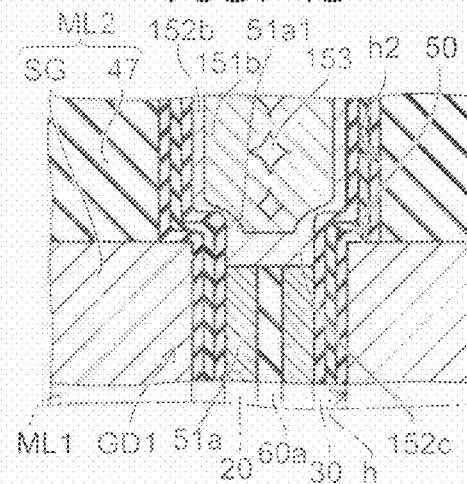

FIG. 4A illustrates an example of when a cubical expansion part 51a1 that bulges to the center axis side of the hole h2 is formed by providing the step part 50 to that illustrated in FIG. 3A.

As illustrated in FIG. 4A, the stacked body ML1 is formed having a plurality of electrode layers WL and a plurality of insulating layers 42 stacked respectively alternating on the substrate 10. The memory film 30 is provided on the sidewall of the hole h (corresponding to one example of the first hole) formed by penetrating through the stacked body ML1 in the stacking direction. The channel body 20 is provided on the inner side of the memory film 30 within the hole h. The inner side of the channel body 20 is a space 60a (corresponding to one example of a second space). Further, the stacked body ML2, which has the selector gates SG and the insulating layer 47 provided thereon, is provided on the stacked body ML1. A gate insulating film GD1 is provided on the sidewall of the hole h2 that communicates with the hole h and that is formed by penetrating through the stacked body ML2 in the stacking direction. The channel body 51a that is connected with the channel body 20 is provided on the inner side of the gate insulating film GD1 in the hole h2. In other words, the channel bodies 20 and 51a are provided on the inner side of the memory film 30 and the inner side of the gate insulating film GD1. The step part 50 is formed between the side face of the selector gate SG and the insulating layer 47.

Further, in the channel body 51a, the film thickness of the portion (cubical expansion part) 51a1 that covers the step part 50 is thicker than the film thickness of the portion provided between the insulating layers 47. The cubical expansion part 51a1 of the channel body 51a narrows an opening of the space 60a near the step part 50. Note, the configuration may be provided in which the opening of the space 60a is obstructed by the cubicle expansion part 51a1.

Further, the region 151 positioned near the top end of the selector gate SG of the channel body 51a is silicided. In this case, the bottom end of the silicided region 151 is provided lower than the top end of the selector gate SG. In other words, the bottom end of the silicided region 151 is in the same position as the top end of the selector gate SG, or the bottom end of the silicided region 151 is in a lower position beyond the top end of the selector gate SG. Note, the main components and the like of the silicided region 151 are similar to those illustrated in FIG. 3A.

In this case, the effect of forming the silicided region 151 is similar to that illustrated in FIG. 3A.

Even more, the effects given below are achieved with this embodiment.

In this embodiment, the cubical expansion part 51a1 that bulges to the center axis side of the hole h2 is formed by providing the step part 50. Therefore, the deposit efficiency of the metal sputtered on the portion that covers the step part 50 is higher than the side face of the channel body 51a formed on the sidewall of the hole h2 between the insulating layers 47. Accordingly, metal can be contained in a higher concentration than in other portions that are near the portion that covers the step part 50 in the channel body 51a.

Further, because the cubical expansion part 51a1 is formed, penetration of the sputtered metal to silicide the region 151 into the channel body 51a side between the selector gates SG can be suppressed. By so doing, the cutoff characteristics of the selection transistor can be raised to enable the off leakage current Ioff to be suppressed.

FIG. 4B to FIG. 4F illustrate examples of when the cubical expansion part 51a1 that bulges to the center axis side of the hole h2 is formed by providing the step part 50 to that illustrated in FIG. 3B to FIG. 3F. In this case, explanations relating to the silicided region, the segregating part, the concave and convex portions, the space, and the like for these respective cases are similar to those illustrated in FIG. 3B to FIG. 3F and therefore detailed explanations thereof will be omitted. Further, explanations relating to the step part 50 and the cubical expansion part 51a1 are similar to those illustrated in FIG. 4A and therefore detailed explanations thereof will be omitted.

Second Embodiment

Next, a manufacturing method for the semiconductor memory device according to a second embodiment will be described.

Note, in the description given hereinafter, a description will be made mainly of the method for forming a memory cell array. FIGS. 5 through 9 are schematic process cross-sectional views illustrating the method of manufacturing the semiconductor memory device according to the second embodiment.

The back gate BG is provided on the substrate 10 via an insulating layer not illustrated. The back gate BG is, for example, a silicon layer doped with an impurity such as boron or the like.

Figure 5A:
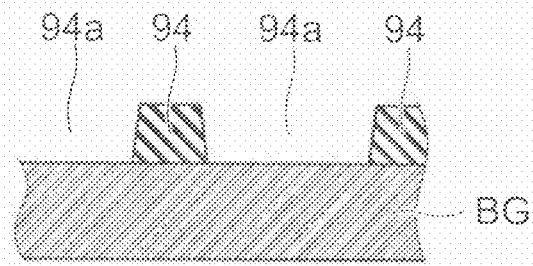
FIG. 5A to FIG. 5D are schematic process cross-sectional views illustrating the method of manufacturing the semiconductor memory device according to the second embodiment.

Then, a resist 94 is formed on the back gate BG as illustrated in FIG. 5A. The resist 94 undergoes patterning and includes a selectively formed opening 94a.

Figure 5B:
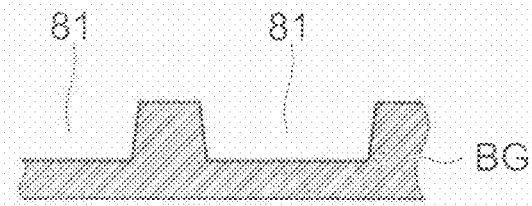
Figure 5C:
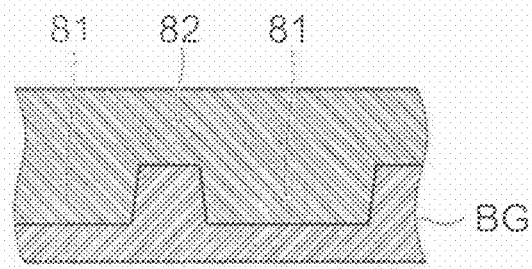

Next, as illustrated in FIG. 5B, the back gate BG selectively undergoes dry etching using the resist 94 as a mask. By so doing, a recess 81 is formed on the back gate BG. Next, as illustrated in FIG. 5C, a sacrifice film 82 is embedded in the recess 81. The sacrifice film 82 is, for example, a silicon nitride film, a non-doped silicon film, or the like.

Figure 5D:
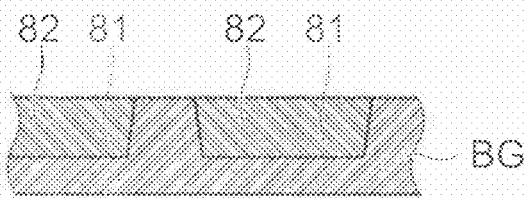

Afterwards, as illustrated in FIG. 5D, the entire surface of the sacrifice film 82 undergoes etching to expose the surface of the back gate BG between the recess 81 and the recess 81.

Figure 6A:
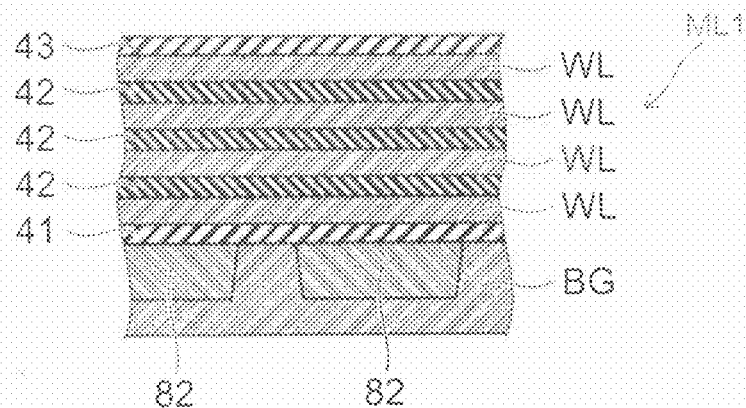
FIGS. 6A to 6C are schematic process cross-sectional views illustrating subsequent to FIGS. 5A to 5D.

Next, as illustrated in FIG. 6A, after the insulating film 41 is formed on the back gate BG, the stacked body ML1 that includes a plurality of electrode layers WL and a plurality of insulating layers 42 is formed thereon. In other words, the stacked body ML1 is formed having a plurality of electrode layers WL and a plurality of insulating layers 42 respectively stacked alternating on the substrate 10. The electrode layers WL and the insulating layers 42 are alternatingly stacked, and the insulating layers 42 are interposed between the electrode layers WL. An insulating film 43 is formed on the topmost layer of the electrode layers WL.

Figure 6B:
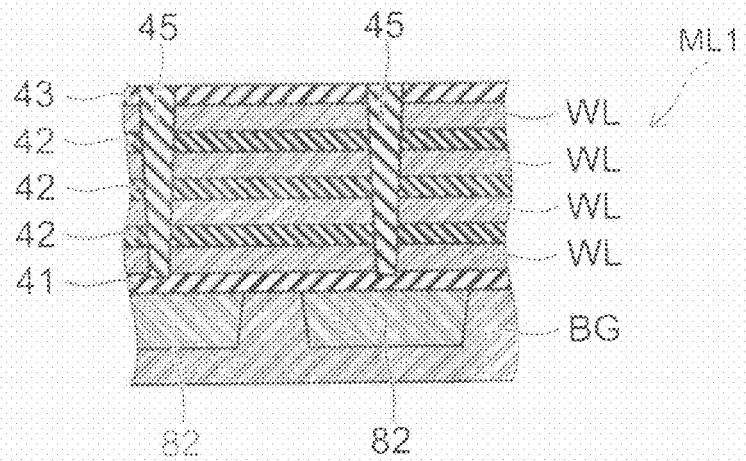

Next, as illustrated in FIG. 6B, after the stacked body ML1 is divided by a photolithography method and an etching method and a groove that reaches the insulating film 41 has been formed, such groove is embedded with the insulating film 45. After embedding the groove with the insulating film 45, the insulating film 43 is exposed by etching the entire surface.

Figure 6C:
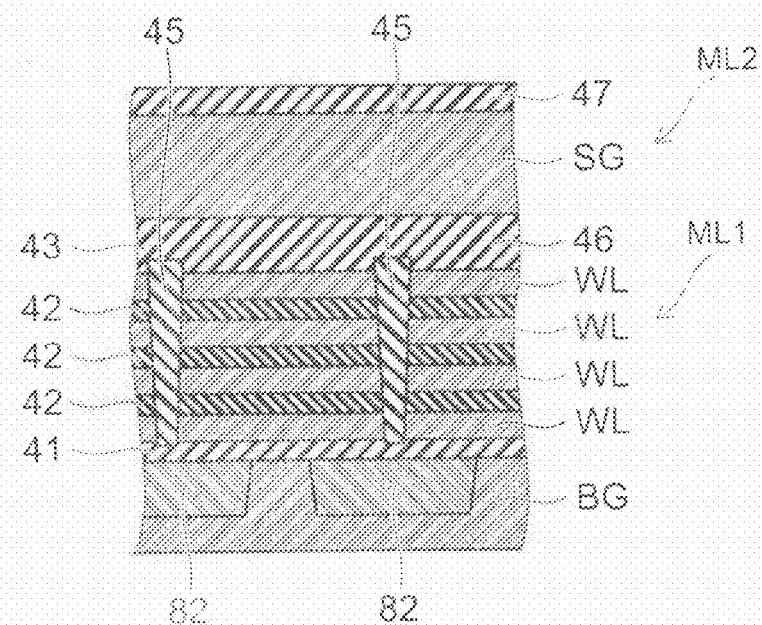

Next, as illustrated in FIG. 6C, an insulating film 46 is formed on the insulating film 43. In addition, the stacked body ML2 that includes the selector gate SG and the insulating layer 47 is formed on the insulating film 46. In other words, the stacked body ML2 in which the selector gate SG and the insulating layer 47 are formed in that order is formed on the stacked body ML1. In this case, the selector gate SG is formed on the insulating film 46, and the insulating layer 47 is formed on the selector gate SG.

Figure 7A:
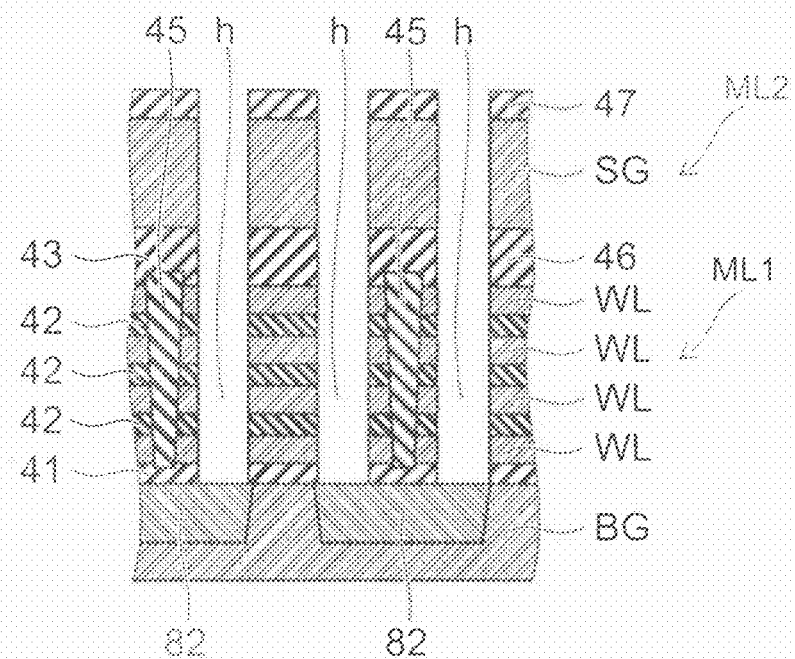
FIGS. 7A to 7B are schematic process cross-sectional views illustrating subsequent to FIGS. 6A to 6C.

Next, as illustrated in FIG. 7A, the hole h is formed in the stacked body ML1 and the stacked body ML2 on the back gate BG. The hole h is formed by, for example, a reactive ion etching (RIE) method using a mask (not illustrated). The bottom end of the hole h reaches the sacrifice film 82 and the sacrifice film 82 is exposed at the bottom of the hole h. A pair of holes h is positioned over one sacrifice film 82 such that the insulating film 45 positioned substantially in the center of the sacrifice film 82 is sandwiched.

Next, the sacrifice film 82 is removed through the hole h by, for example, a wet etching method. The etching solution used at this time may be, for example, an alkali series chemical solution of KOH (potassium hydroxide) solution or the like or a phosphoric acid solution ($H_3PO_4$) in which the etching rate has been adjusted depending on temperature conditions.

Figure 7B:
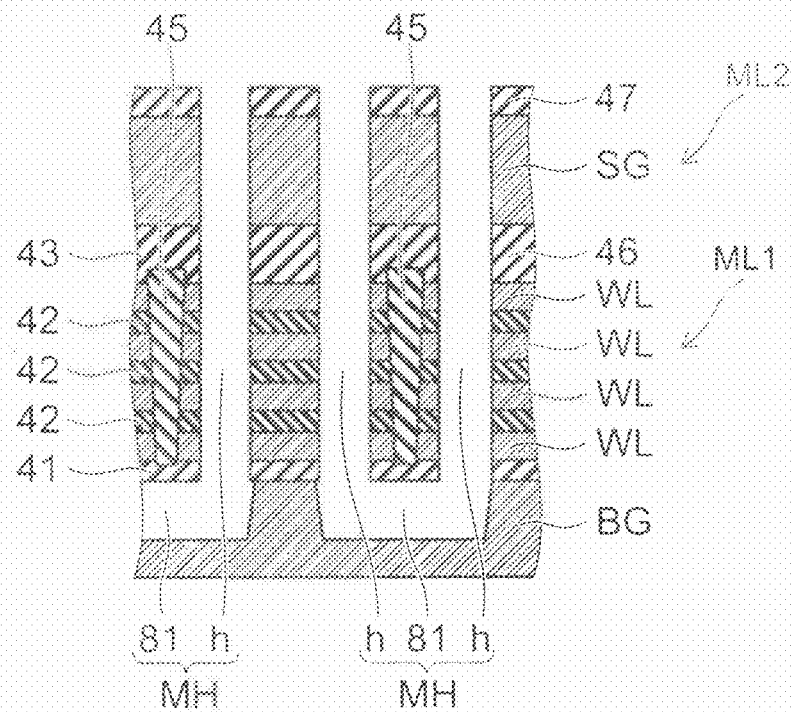

By so doing, the sacrifice film 82 is removed as illustrated in FIG. 7B. By removing the sacrifice film 82, the recess 81 is formed in the back gate BG. A pair of holes h is connected with one recess 81. In other words, the respective bottom ends of a pair of holes h are connected with a single common recess 81 to form one U shaped memory hole MH.

Afterwards, the memory film 30 illustrated in FIG. 2 is formed on the inner wall of the memory hole MH in the stacked body ML1 that includes a plurality of electrode layers WL. Further, a silicon film is formed as the channel body 20 on the inner side of the memory film 30 within the memory hole MH.

Meanwhile, the following process is implemented on the stacked body ML2 that includes the selector gate SG.

The process described in the example given hereinafter is performed after the memory hole MH illustrated in FIG. 7B has been formed. Note, with the memory hole MH, the portion that particularly penetrates through the stacked body ML2 that includes the selector gate SG and the insulating layer 47 becomes the hole h2.

Figure 8A:
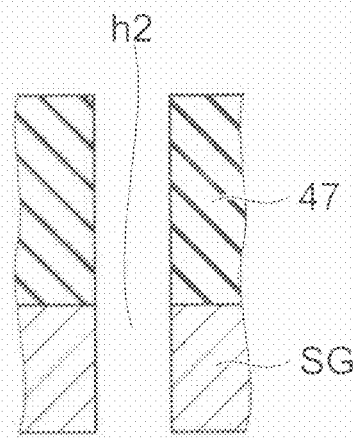
FIGS. 8A to 8C are schematic process cross-sectional views illustrating subsequent to FIGS. 7A to 7B.

FIG. 8A illustrates a state in which the hole h2 is formed in the stacked body ML2.

Further, the step part 50 is further formed in the example illustrated in FIG. 4A to FIG. 4F.

First, after the hole h2 illustrated in FIG. 8A is formed, a treatment is performed that uses, for example, a diluted hydrofluoric acid. In this treatment, a silicon oxide based insulating layer 47 is etched. Further, this diluted hydrofluoric acid treatment doubles as deposit removal by an RIE method at the time of forming the hole h2 and as a film formation pretreatment for the gate insulating film GD.

Figure 8B:
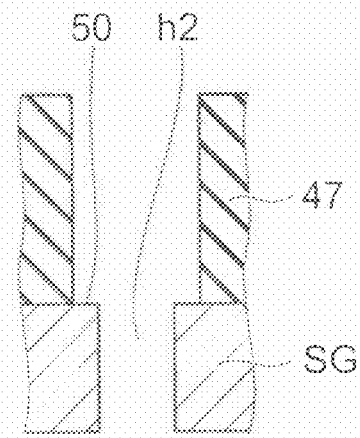

As illustrated in FIG. 8B, by way of this etching process, the sidewall that is exposed to the hole h2 of the insulating layer 47 retreats in a direction to separate from the center axis of the hole h2. For example, the retreating amount of the sidewall of the insulating layer 47 is approximately 5 nm. Therefore, the hole diameter between the insulating layers 47 in the hole h2 is larger than the hole diameter between the selector gates SG. Therefore, the step part 50 is formed between the side face of the selector gate SG and the insulating layer 47.

An example will be given hereinafter of forming that which is illustrated in FIG. 4A to FIG. 4F.

Figure 8C:
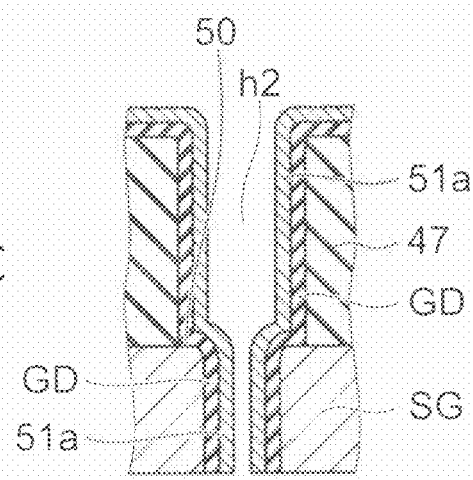

First, as illustrated in FIG. 8C, the gate insulating film GD is formed on the sidewall of the hole h2. The gate insulating film GD covers the step part 50 along the step part 50, and a step part is also formed on the gate insulating film GD. The gate insulating film GD is a silicon oxide film or a silicone nitride film formed by, for example, a chemical vapor deposition (CVD) method.

Next, a polysilicon film is formed to be the channel body 51a by, for example, a CVD method, on the inner side of the gate insulating film GD in the hole h2.

The channel body 51a is connected to the channel body 20 in the memory cell. The channel body 51 covers the step part 50 with the gate insulating film GD interposed therebetween, and a step part is also formed on the channel body 51a.

Next, when forming the segregating part, impurities are injected into the silicided region of the channel body 51a using an ion injection method. For example, a dosage of $5 \times 10^{15}/cm^2$ of arsenic (As), being an n-type impurity, can be injected into the silicided region of the channel body 51a at an acceleration voltage of 10 keV. In addition, the impurity is diffused to the silicided region of the channel body 51a by performing active annealing that heats to a temperature of 1,000° C. for 10 seconds.

Next, the region positioned near the top end of the selector gate SG of the channel body 51a is silicided.

First, metal is deposited on the channel body 51a by a sputtering method. In this case, the deposited metal may be, for example, tungsten, nickel, cobalt, platinum, zirconium, hafnium, holmium, yttrium, or the like.

Further, silicide annealing is performed to heat to a temperature of between 300° C. and 600° C.

In this case, the concave and convex portions 151a are formed by appropriately setting a heating temperature. For example, a configuration may be provided in which the concave and convex portions 151a can be formed by heating to, for example, not less than 600° C.

Further, a configuration may be provided in which the silicided region 151b is expanded and the space 153 is formed by appropriately setting the thickness of the channel body 51a that is formed on the inner side of the gate insulating film GD.

Further, when injecting and diffusing impurities in order to form the segregating part, the impurities are segregated near the boundary in the silicided region by performing silicide annealing. For example, as illustrated in FIG. 3B, FIG. 3D, FIG. 3F, FIG. 4B, FIG. 4D, and FIG. 4F, the impurities can be segregated near the boundary between the silicided region and the non-silicided region of the channel body, and the impurities can be segregated near the boundary between the silicided region and the gate insulating film GD. Here, in the channel body 51a, the portion that covers the step part 50 between the side face of the selector gate SG and the insulating layer 47 is formed so as to be along the step part 50 and to bulge at the center axis side of the hole h2. Therefore, the deposit efficiency of the metal on the portion that covers the step part 50, and the injection efficiency of the impurities, are higher than the side face of the channel body 51a formed on the sidewall of the hole h2 between the insulating layers 47. Accordingly, the portion that covers the step part 50 in the channel body 51a contains a higher concentration of metal and impurities than other portions. Therefore, the effect of forming the silicided region described above and the effect of forming the segregating part can be further improved.

Further, in the portion that covers the step part 50 in the channel body 51a, the cubic volume expands due to the increase in the concentration of the impurity and the metal over other portions, and thereafter, further cubic expansion occurs due to suicide annealing. For example, the cubic volume of the channel body 51a after silicide annealing expands approximately 2 to 3 times in size.

Figure 9A:
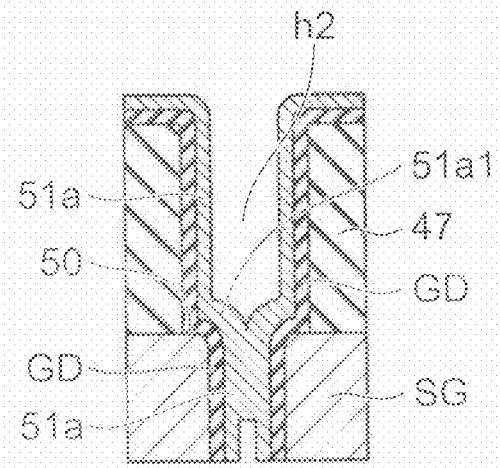
FIGS. 9A to 9C are schematic process cross-sectional views illustrating subsequent to FIGS. 8A to 8C.

Therefore, as illustrated in FIG. 9A, the film thickness of the portion (cubical expansion part) 51a1 that covers the step part 50 in the channel body 51 is thicker than the film thickness of the portion provided between the insulating layers 47.

In this case, a configuration may also be provided in which the opening of the hole h2 is obstructed by the cubical expansion part 51a1 of the channel body 51.

In addition, the film thickness of the channel body 51a may be appropriately set in accordance with the film thickness of the gate insulating film GD and the hole diameter of the hole h2 in order to obstruct the opening of the hole h2 by the cubic expansion. In this case, the smaller the hole diameter of the hole h2, the thinner the film thickness of the channel body 51a to enable the opening of the hole h2 to be obstructed by the cubic expansion. Furthermore, the thicker the film thickness of the gate insulating film GD, the thinner the thickness of the channel body 51a to enable the opening of the hole h2 to be obstructed by the cubic expansion.

Note, the opening of the hole h2 may not be obstructed by the cubical expansion part 51a1. When not obstructing the opening of the hole h2, as illustrated in FIGS. 3 and 4, for example, silicon oxide or silicon nitride is embedded in the channel bodies 51 and 51a and insulating parts 60 and 60a are formed by etching back.

Figure 9B:
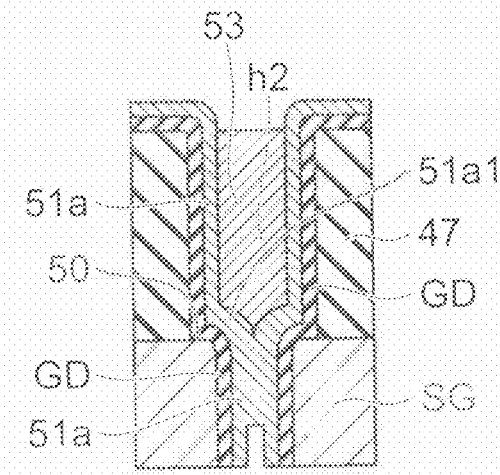

Next, as illustrated in FIG. 9B, the wiring electrode part 53 is formed in the hole h2 further above the selector gate SG. For example, when the opening of the hole h2 is obstructed by the cubical expansion part 51a1, the wiring electrode part 53 is formed on the inner side of the channel body 51a further above the portion obstructed by the cubical expansion part 51a1. When the opening of the hole h2 is not obstructed by the cubical expansion part 51a1, the wiring electrode part 53 is formed on the inner side of the channel body 51a further above the portion where the insulating parts 60 and 60a are formed.

For example, amorphous silicon doped with phosphorus at a dosage of not less than $1 \times 10^{20}/cm^2$ is embedded within the hole h2 further above the cubical expansion part 51a1 during film formation.

Further, for example, a metal such as tungsten or the like may be embedded within the hole h2 further above the cubical expansion part 51a1.

Thereafter, the gate insulating film GD on the top surface of the insulating layer 47, the channel body 51a and the wiring electrode part 53 are removed using a reactive ion etching (RIE) method. Further, when amorphous silicon doped with phosphorus or the like is embedded, applying heat treatment creates a polycrystalline silicon. In this case, the wiring electrode part 53 is formed from the polycrystalline silicon doped with phosphorus or the like as an impurity.

Figure 9C:
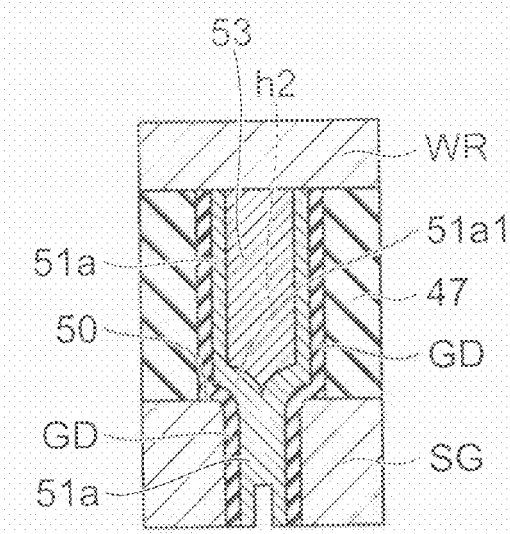

Continuing, as illustrated in FIG. 9C, wiring WR is formed as a bit line BL or a source line SL on the insulating layer 47. The channel body 51a and the wiring electrode part 53 are electrically connected to the wiring WR.

In other words, the method of manufacturing a semiconductor memory device according to this embodiment may include the processes given below.

On a substrate 10, a process that forms a stacked body ML1 having a plurality of electrode layers WL and a plurality of insulating layers 42 stacked to respectively alternate; a process that forms a stacked body ML2 where a selector gate SG and an insulating layer 47 are formed in that order on the stacked body ML1; a process that forms a hole h that penetrates through the stacked body ML1 in the stacking direction, and that forms a hole h2 communicating with the hole h, that penetrates through the stacked body ML2 in the stacking direction; a process that forms a step part 50 between the side face of the selector gate SG and the insulating layer 47 in which the hole diameter of the hole h2 between the insulating layers 47 is larger than the hole diameter of the hole h2 between the selector gates SG; a process that forms a memory film 30 on the sidewall of the hole h; a process that forms a gate insulating film GD on the sidewall of the hole h2; a process that forms a channel body on the inner side of the memory film 30 and on the inner side of the gate insulating film GD; and a process that silicides a region positioned near the top end of the selector gate SG of the channel body.

Further, processes for forming segregating parts and concave and convex portions as described above may also be provided.

For example, a process that injects impurities into a region positioned near the top end of the selector gate SG of the channel body is further provided, and in the above-mentioned siliciding process, a configuration may be provided for segregating impurities injected near the boundary between the silicided region and the non-silicided region of the channel body.

Figure 10:
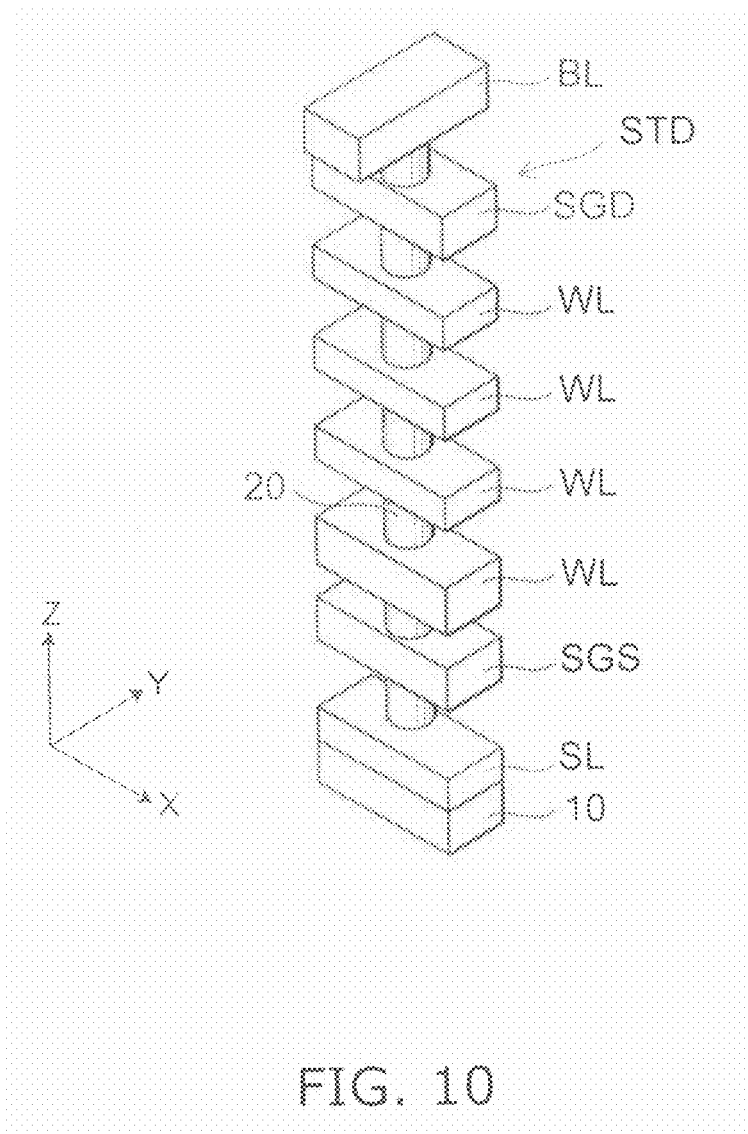
FIG. 10 is a schematic perspective view of a memory string according to another embodiment.

Note, although that described in the examples given above have a U shaped memory string MS in the semiconductor memory device 1, it is by no means limited to that. For example, a semiconductor memory device having an I shaped memory string such as that illustrated in FIG. 10 is also acceptable. Note, FIG. 10 illustrates only the conductive portion while the insulating portion is omitted from the drawing.

With the structure illustrated in the example in FIG. 10, a source line SL is provided on a substrate 10, a side selector gate (or a lower selector gate) SGS is provided thereon, a plurality of (for example 4 layers) electrode layers WL are provided thereon, and a drain side selector gate (or upper selector gate) SGD is provided between the topmost layer of the electrode layer WL and the bit line BL.

The configurations illustrated in the examples given in FIGS. 3 and 4 for the drain side select transistor STD provided on the top end part of the memory string can be applied to even a semiconductor memory device that has this type of I shaped memory string. Further, the manufacturing methods illustrated in the examples in FIGS. 8 and 9 can be applied.

According to the embodiments given in the examples described above, a semiconductor memory device that can obtain a sufficient erasing speed, and a manufacturing method thereof, can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor memory device comprising: a substrate;
   a first stacked body having a plurality of electrode layers and a plurality of first insulating layers stacked on the substrate so as to be respectively alternating;
   a second stacked body provided on the first stacked body, having a selector gate and a second insulating layer provided thereon;
   a memory film provided on a sidewall of a first hole that penetrates through the first stacked body in the stacking direction;

a gate insulating film provided on a sidewall of a second hole that penetrates through the second stacked body in the stacking direction, the second hole communicating with the first hole; and a channel body provided on an inner side of the memory film and on an inner side of the gate insulating film, wherein a step part is provided between a side face of the selector gate and the second insulating layer; and a region positioned near a top end of the selector gate of the channel body is silicided.

2. The device according to claim 1, wherein a bottom end of the silicided region is provided lower than the top end of the selector gate.

3. The device according to claim 1, wherein a first segregating part in which an impurity is segregated is provided near a boundary between the silicided region and a non-silicided region of the channel body.

4. The device according to claim 3, wherein a bottom end of the first segregating part is provided lower than the top end of the selector gate.

5. The device according to claim 1, wherein a second segregating part in which an impurity is segregated is provided near a boundary between the silicided region and the gate insulating film.

6. The device according to claim 5, wherein the second segregating part is provided integrally with the first segregating part.

7. The device according to claim 1, further comprising a wiring electrode part that is provided on an inner side of the channel body and upward of the selector gate, and a concave and convex portion is provided on a surface of the wiring electrode part side of the silicided region.

8. The device according to claim 7, wherein a first segregating part in which an impurity is segregated is provided near the boundary between the silicided region and a non-silicided region of the channel body.

9. The device according to claim 8, wherein a bottom end of the first segregating part is provided lower than the top end of the selector gate.

10. The device according to claim 7, wherein a second segregating part in which an impurity is segregated is provided near a boundary between the silicided region and the gate insulating film.

11. The device according to claim 10, wherein the second segregating part is integrally provided with the first segregating part.

12. The device according to claim 1, wherein a first space is provided within the silicided region.

13. The device according to claim 1, wherein the silicided region is a wiring electrode part provided on an inner side of the channel body and upward of the selector gate.

14. The device according to claim 12, wherein a first segregating part in which an impurity is segregated is provided near a boundary between the silicided region and a non-silicided region of the channel body.

15. The device according to claim 14, wherein the bottom end of the first segregating part is provided lower than the top end of the selector gate.

16. The device according to claim 12, wherein a second segregating part in which an impurity is segregated is provided near a boundary between the silicided region and the gate insulating film.

17. The device according to claim 16, wherein the second segregating part is provided integrally with the first segregating part.

18. The device according to claim 1, wherein a cubical expansion part that bulges to a center axis side of the second hole is provided in the silicided region.

19. The device according to claim 18, wherein the cubical expansion part is provided near the step part.

20. The device according to claim 18, wherein a second space is provided on an inner side of the channel body, and the cubical expansion part is provided upward of an opening of the second space.

* * * * *